US006603258B1

(12) United States Patent
Mueller-Mach et al.

(10) Patent No.: US 6,603,258 B1
(45) Date of Patent: Aug. 5, 2003

(54) LIGHT EMITTING DIODE DEVICE THAT EMITS WHITE LIGHT

(75) Inventors: Regina Mueller-Mach, San Jose, CA (US); Gerd O. Mueller, San Jose, CA (US); Paul S. Martin, Pleasanton, CA (US)

(73) Assignee: Lumileds Lighting, U.S. LLC, San Jose, CA (US)

( * ) Notice: Subject to any disclaimer, the term of this patent is extended or adjusted under 35 U.S.C. 154(b) by 0 days.

(21) Appl. No.: 09/556,770

(22) Filed: Apr. 24, 2000

(51) Int. Cl.[7] .................................................. H01J 1/54
(52) U.S. Cl. ....................... 313/501; 313/502; 313/503; 313/496; 313/113; 313/485; 313/486
(58) Field of Search ................................ 313/467, 503, 313/504, 485, 486, 487, 113, 496, 501, 502

(56) References Cited

U.S. PATENT DOCUMENTS

| | | | | |
|---|---|---|---|---|
| 4,907,044 | A | * 3/1990 | Schellhorn et al. | 357/17 |
| 5,457,356 | A | * 10/1995 | Parados | 313/505 |
| 5,957,560 | A | 9/1999 | Do et al. | 353/88 |
| 6,066,861 | A | * 5/2000 | Hohn et al. | 257/99 |
| 6,212,213 | B1 | 4/2001 | Weber et al. | 372/50 |
| 6,252,254 | B1 | 6/2001 | Soules et al. | 257/89 |
| 6,273,589 | B1 | 8/2001 | Weber et al. | 362/293 |
| 6,299,338 | B1 | * 10/2001 | Levinson et al. | 362/559 |
| 6,310,364 | B1 | * 10/2001 | Uemura | 257/100 |
| 2002/0028527 | A1 | * 3/2002 | Maeda et al. | 438/29 |

FOREIGN PATENT DOCUMENTS

| | | | |
|---|---|---|---|
| JP | 62280056 | * 12/1987 | 346/33 A |
| WO | WO 00/33389 | 6/2000 | |
| WO | WO 00/33390 | 6/2000 | |

* cited by examiner

Primary Examiner—Ashok Patel
(74) Attorney, Agent, or Firm—Patent Law Group LLP; Rachel V. Leiterman

(57) ABSTRACT

A white-light emitting diode (LED) is provided that emits primary light at a wavelength that is in the range of 485 to 515 nanometers (nm), which corresponds to a bluish-green color. A portion of the primary light is converted into a reddish-colored light that ranges in wavelength from approximately 600 to approximately 620 nm. At least a portion of the converted light combines with the unconverted portion of the primary light to produce white light. A number of phosphor-converting elements are suitable for use with the LED, including a resin admixed with a phosphor powder, epoxies admixed with a phosphor powder, organic luminescent dyes, phosphor-converting thin films and phosphor-converting substrates. Preferably, the phosphor-converting element is a resin admixed with a phosphor powder in such a manner that a portion of the primary light impinging on the resin is converted into the reddish-colored light and a portion of the primary light passes through the resin without being converted. The unconverted primary light and the phosphor-converted reddish-colored light combine to produce white light. The LED is mounted in a reflector cup that is filled with the phosphor-converting resin. The LED may be mounted in either a normal or flip-chip configuration within the reflector cup.

14 Claims, 3 Drawing Sheets

LIGHT EMITTING DIODE DEVICE THAT EMITS WHITE LIGHT

TECHNICAL FIELD OF THE INVENTION

The present invention relates to a light emitting diode device and, more particularly, to a light emitting diode device that produces white light by combining primary bluish-green light with phosphor-converted reddish light to produce white light.

BACKGROUND OF THE INVENTION

Light emitting diode devices (LEDs) that are utilized in green traffic lights emit a bluish-green light at wavelengths in the range of approximately 485 to 515 nanometers (nm). The wavelength emission range is specified by law and is a very narrow subset of this range. When these LEDs are produced, they are tested to determine whether or not the emitted light is within the legally specified range. If the LEDs do not meet these specifications, they typically are discarded.

With the development of efficient LEDs that emit light in the spectral range of 450 to 520 nanometers (nm), it has become feasible to produce LEDs that generate white light through phosphor conversion of a portion of the primary emission of the LED to longer wavelengths. An unconverted portion of the primary emission combines with the light of the longer wavelength to produce white light. In order for an LED to produce white light that is good for illumination purposes (i.e., that has good color rendering capabilities), the primary emission should be at a wavelength of less than, for example, 480 nm. However, if the LED is to be used only for signaling or display purposes, the primary emission can be at a wavelength of greater than 480 nm. Phosphor conversion of primary light at a wavelength of greater than 480 nm will still produce light that appears white when viewed directly or through a diffusion screen on which the light impinges. Such an LED would be suitable for use in various types of displays and signaling environments (e.g., pedestrian traffic lights), although it generally would not be suitable for illumination purposes due to its poor color rendering characteristics.

Pedestrian traffic lights are currently the only types of traffic lights that do not utilize LEDs. Pedestrian traffic lights generally use incandescent bulbs for signaling. These bulbs burn out relatively quickly and must be replaced relatively often. It would be desirable to provide an LED that produces white light and that is suitable for this purpose and for other signaling and/or display purposes. LEDs consume less energy than incandescent bulbs and normally have lifetimes that are much greater than incandescent bulbs. Consequently, LEDs require less maintenance and can potentially provide a more economic solution than incandescent bulbs in these types of environments.

Accordingly, a need exists for a white-light emitting LED that is suitable for signaling and/or display purposes.

SUMMARY OF THE INVENTION

The present invention provides a white-light emitting diode (LED) that emits primary light at a wavelength that is in the range of approximately 485 to approximately 515 nm, which corresponds to a color of bluish-green. A portion of the primary light is converted into a reddish-colored light that ranges in wavelength from approximately 600 to approximately 620 nm. At least a portion of the converted light combines with the unconverted portion of the primary light to produce white light. The LED comprises a substrate and a light-emitting structure, which is disposed on a surface of the substrate. The light-emitting structure emits the primary light that impinges on a phosphor-converting element to produce the reddish-colored light that combines with bluish-green light to produce white light.

A number of phosphor-converting elements are suitable for use with the LED of the present invention, including a resin admixed with a phosphor powder, epoxies admixed with a phosphor powder, organic luminescent dyes, phosphor-converting thin films and phosphor-converting substrates. Preferably, the phosphor-converting element is a resin admixed with a phosphor powder in such a manner that a portion of the primary light impinging on the resin is converted into the reddish-colored light and a portion of the primary light passes through the resin without being converted. The unconverted primary light and the phosphor-converted reddish-colored light combine to produce white light. In accordance with this embodiment, the LED is mounted in a reflector cup that is filled with the phosphor-converting resin. The LED can be mounted in either a normal or flip-chip configuration within the reflector cup.

Other features and advantages of the present invention and variations thereof will become apparent from the following description, drawings and claims.

DETAILED DESCRIPTION OF THE DRAWINGS

Figure 1:
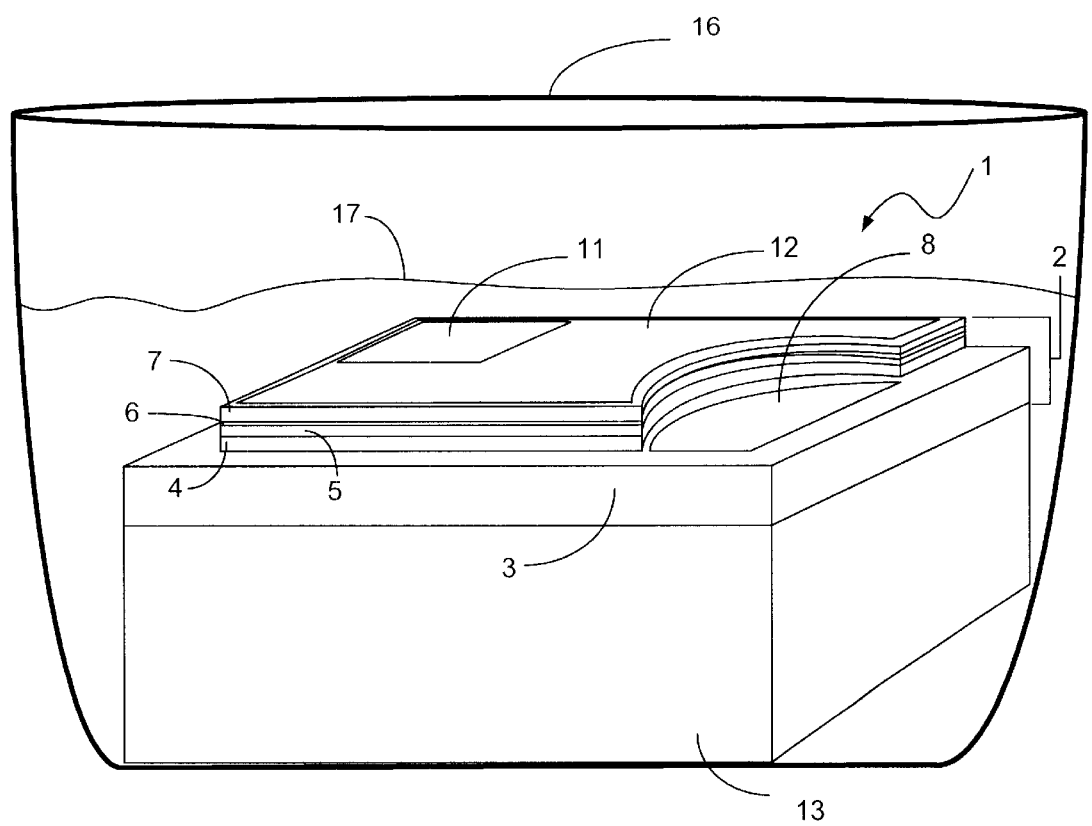
FIG. 1 is a perspective view of the LED of the present invention in accordance with a first embodiment, wherein the LED is disposed within a reflector cup that is filled with a phosphor-converting resin.

FIG. 1 is a perspective view of the light emitting diode (LED) 1 of the present invention in accordance with a first embodiment, wherein the LED is mounted within a reflector cup. The LED 1 of the present invention is not limited to any particular LED design, except that it must be capable of emitting primary light that ranges in wavelength from approximately 485 nm to approximately 515 nm, which generally is a bluish-green color. As stated above, LEDs that are designed for use in green traffic lights produce light of a bluish-green color. Preferably, such an LED is utilized in accordance with the present invention because LEDs that are designed for that particular purpose that do not meet the aforementioned specifications are typically discarded. The present invention can make use of such LEDs to produce white-light emitting LEDs that are suitable for signaling and/or display purposes, but which generally are not designed to meet industry standards for illumination.

The LED 1 comprises, for example, a light emitting structure 2, which comprises two n-GaN layers 3 and 4, an SQW or MQW GaInN layer 5, a p-AlGaN layer 6 and a p-GaN layer 7. The light emitting structure 2 also comprises an n-electrode bond pad 8, an n-electrode 3, a p-electrode bond pad 11 and a p-electrode 12. The n-electrode 3 is comprised of GaN. The electrode bond pads 8 and 11, when connected to a power supply (not shown), provide the biasing current that causes the LED 1 to emit the primary light that is bluish-green and ranges in wavelength from approximately 485 to approximately 515 nm.

It should be noted that the materials used for creating the LED 1 are not limited to the materials discussed above with reference to FIG. 1. Those skilled in the art will understand that the LED 1 can be comprised of various types of materials. As stated above, the LED 1 is not limited to any particular type of LED, with the exception that the LED device utilized in accordance with the present invention by one that emits a primary light that is bluish-green in color and ranges in wavelength from approximately 485 to 515 nm. Those skilled in the art will understand that various LEDs are known that are suitable for this purpose.

The light emitting structure 2 that generates the primary emission preferably is grown epitaxially on either a sapphire ($Al_2O_3$) or silicon carbide (SiC) substrate 13, which are both transparent to the primary emission. In accordance with the embodiment shown in FIG. 1, the LED 1 is mounted in a reflector cup 16 in a configuration that is commonly referred to as a "normal" mounting configuration. The reflector cup preferably is filled with a phosphor-converting resin 17. Alternatively, the reflector cup 16 could be filled with an epoxy or a luminescent dye. During operation, when the LED 1 is driven, primary radiation emitted by the LED 1 impinges on the phosphor-converting resin 17. A portion of the primary radiation impinging on the resin 17 is converted by the resin 17 into reddish light. The reddish light ranges in wavelength from approximately 600 to approximately 620 nm. An unconverted portion of the primary radiation passes through the resin and combines with the reddish light to produce white light.

Figure 2:
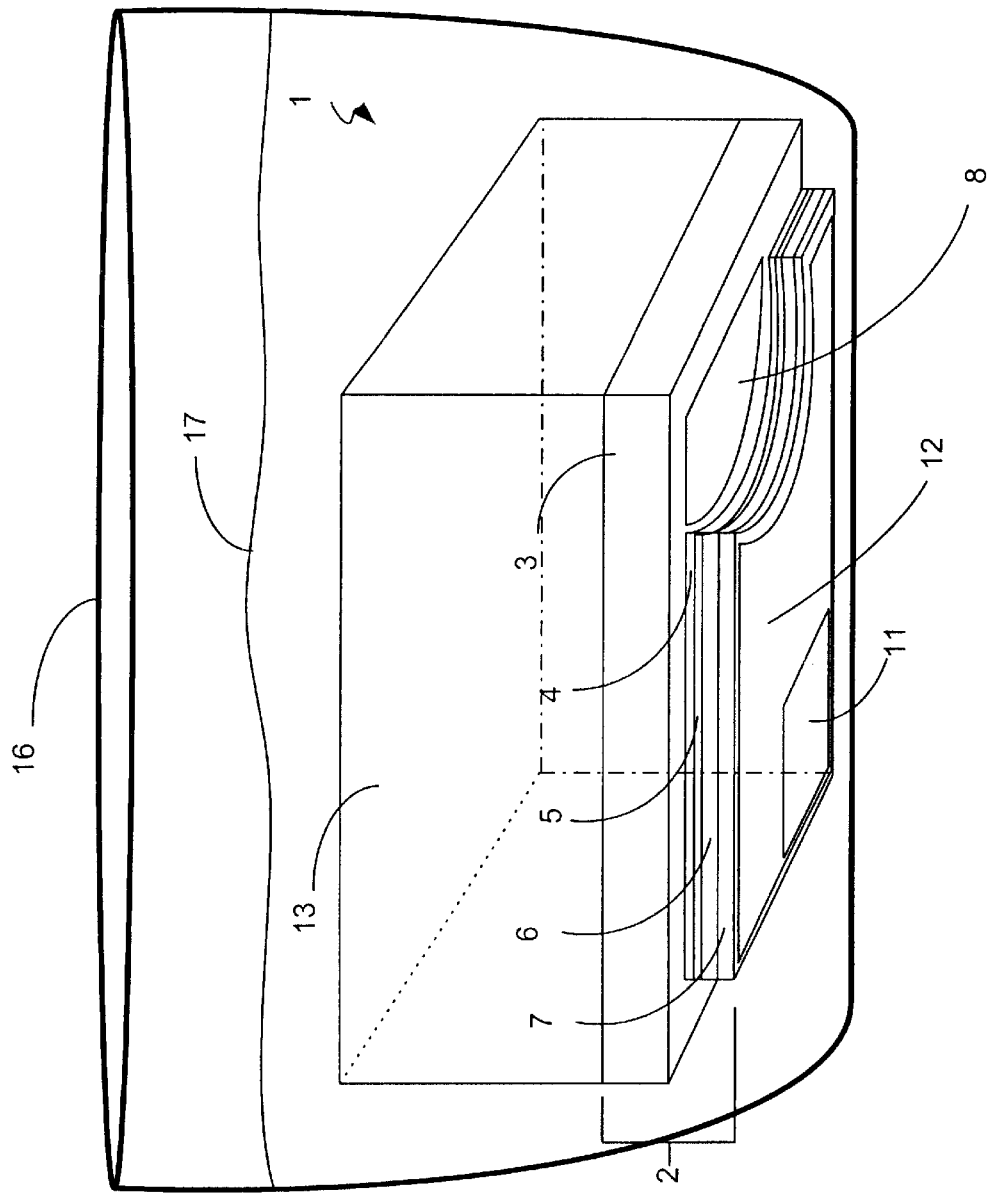
FIG. 2 is a perspective view of the LED of the present invention in accordance with a second embodiment, wherein the LED is disposed in a flip-chip configuration within a reflector cup that is filled with a phosphor-converting resin.

FIG. 2 is a perspective view of the LED 1 of the present invention in accordance with an alternative embodiment, wherein the LED 1 is mounted within the reflector cup 16 in a "flip-chip" mounting configuration. Therefore, the various components of the LED 1 will not be reiterated. In a flip-chip mounting configuration, the p-electrode bond pad 11 is electrically coupled by a conductive element (not shown) to the inner surface of the reflector cup 16, which is comprised of a conductive material. As with the embodiment shown in FIG. 1, the reflector cup 16 preferably is filled with a phosphor-converting resin 17. Alternatively, the reflector cup could be filled with a phosphor-converting epoxy or with a phosphor-converting dye. The substrate 13 is transparent and the p-electrode 12 is reflective such that the primary emissions generated by the light emitting structure are reflected away from the p-electrode 12 and pass through the substrate 13 and into the resin 17. As with the embodiment shown in FIG. 1, the substrate 13 may be comprised of a variety of materials, including sapphire and silicon carbide, both of which are transparent to the primary emission. However, in accordance with the embodiment shown FIG. 2, the p-electrode 12 is reflective, whereas with the embodiment shown in FIG. 1, the p-electrode 12 is transparent.

It should be noted that the primary light may comprise light having more than one wavelength. Similarly, the light emitted by the phosphor-converting element in response to excitation by the primary light may comprise light of more than one wavelength. For example, the primary light emitted by the light emitting structure 2 may correspond to a plurality of wavelengths making up a spectral band. Likewise, the reddish-colored light emitted by the resin 17 may correspond to a plurality of wavelengths making up a spectral band. Wavelengths in these spectral bands may then combine to produce white light. Therefore, although individual wavelengths are discussed herein for purposes of explaining the concepts and principles of the present invention, it will be understood by those skilled in the art that the excitation being discussed herein may be caused by and result in the emission of a plurality of wavelengths, or a spectral band. Therefore, the term "spectral band" is intended to denote a band of at least one wavelength and of potentially many wavelengths. The term "wavelength" is intended to denote the wavelength of the peak intensity of a spectral band.

The phosphor-converting resin 17 preferably is a resin comprising phosphor selected from the phosphor family chemically identified as $(Sr,Ca,Ba)S:Eu^{2+}$. One phosphor selected from this family is Strontium sulfide doped with Europium, which is chemically defined as $SrS:Eu^{2+}$ and which has a peak emission at 610 nm. However, other phosphors may be admixed with resin to produce the phosphor-converting resin 17, as will be understood by those skilled in the art. Rather than using phosphor-converting resins, dyes or epoxies, other types of phosphor-converting elements may also be used, including phosphor-converting thin films, phosphor-converting substrates, or various combinations of these elements. Phosphor-converting thin films and phosphor-converting substrates that are suitable for this purpose are disclosed in copending U.S. patent applications Ser. Nos. 09/407,231, 09/407,228 and 09/405,938, all filed on Sep. 27, 1999, which are assigned to the assignee of the present application and which are hereby incorporated by reference herein in their entirety.

These applications also discuss the manner in which these phosphor-converting elements may be utilized to perform phosphor conversion. The manner in which these various types of phosphor-converting elements can be used in accordance with the LED of the present invention to convert a portion of the primary bluish-green light emitted by the LED into a reddish-colored light that combines with the unconverted portion of the primary bluish-green light to produce white light will be understood by those skilled in the art. Therefore, the manner in which these phosphor-converting elements can be utilized in accordance with the present invention will not be discussed herein.

Figure 3:
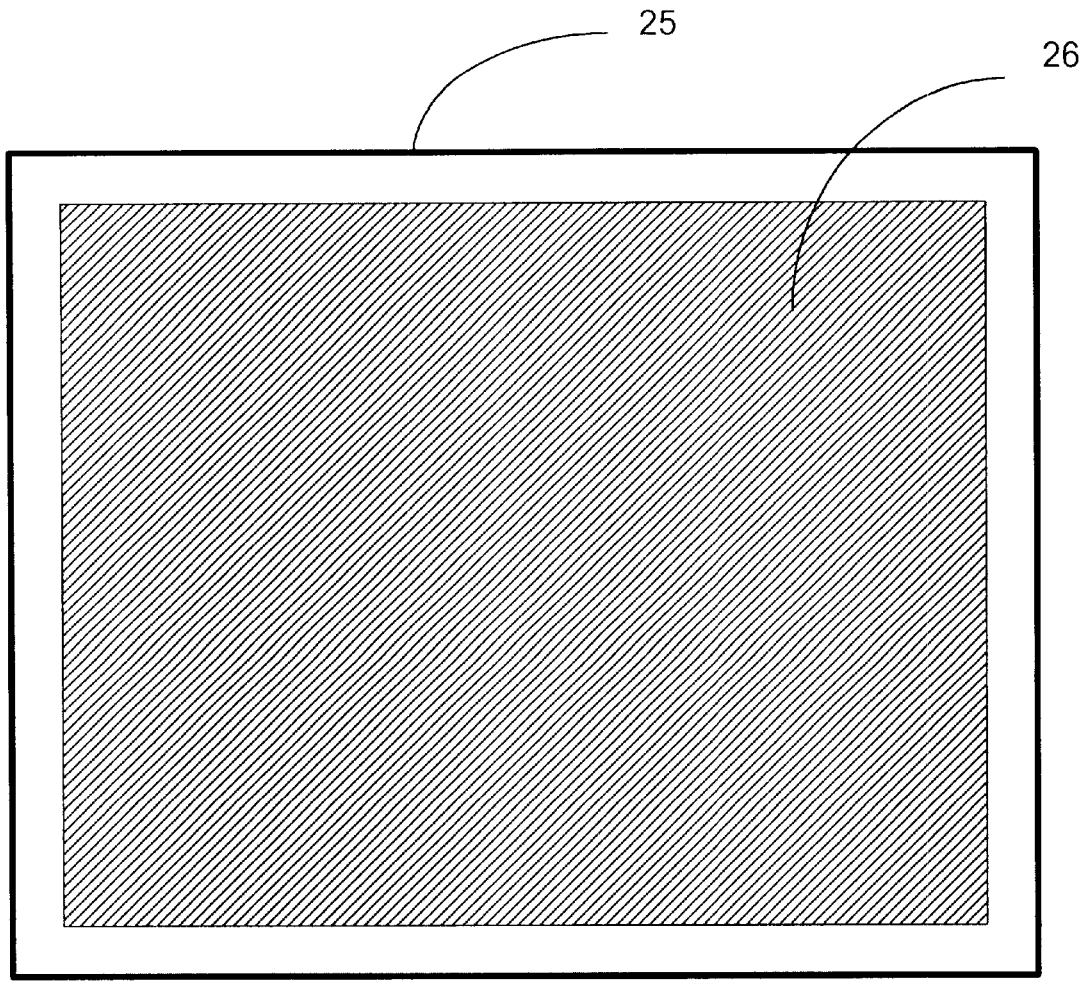
FIG. 3 is a plan view of a diffusing element that may be utilized with the white-light emitting LED of the present invention shown in FIGS. 1 and 2 to provide a light-emitting device that is diffuse in nature and thus suitable for signaling and/or display purposes.

The LED of the present invention will produce white light that is suitable for signaling and display purposes, but generally not for illumination purposes. When one or more LEDs of the present invention are used in conjunction with a diffusing element, such as the diffusing element 25 shown in FIG. 3, the roughened nature of the diffusing element, which is intended to be represented by the hash marks 26 of the diffusing element 25, will cause the white light to be diffuse, or spread out or soften. The diffusing element 25 could represent the frosted diffuser plate of a pedestrian "WALK" traffic light, for example. Those skilled in the art will understand the manner in which the LED of the present invention could be used with various types of diffusers to provide useful functions. It should also be noted that the diffuser could simply be the front surface of the resin dome covering the LED.

It should be noted that the present invention has been described with respect to various embodiments in order to illustrate the concepts and principles of the present inventions. However, the present invention is not limited to these embodiments. Those skilled in the art will understand that various modifications can be made to the embodiments discussed herein that are within the scope of the present invention. For example, although the present invention has been discussed with respect to an LED comprised of certain materials, those skilled in the art will understand that the present invention is not limited to an LED comprised of those materials. Also, although the present invention has been described in detail with respect to the reflector cup mounting configurations shown in FIGS. 1 and 2, those skilled in the art will understand that the present invention is not limited to these particular mounting configurations. Similarly, the present invention is not limited exclusively to the phosphor-converting elements discussed herein. Those skilled in the art will understand that variations can be made with respect to all of these aspects of the embodiments discussed above without deviating from the scope of the present invention.

What is claimed is:

1. A device for generating white light, the device comprising:

a light emitting device, emitting primary radiation when driven, the primary radiation having at least one wavelength in the range of approximately 485 to approximately 515 nanometers (nm);

a wavelength-converting element comprising a wavelength-converting material, the wavelength-converting element located to receive the primary radiation emitted by the light emitting device, wherein:

a first portion of the primary radiation received by the wavelength-converting element passes through the wavelength-converting element unconverted;

the wavelength-converting material consists essentially of a material capable of receiving a second portion of the primary radiation and converting the second portion to secondary radiation having a peak intensity wavelength in the range of approximately 600 to approximately 620 nm; and the first portion of the primary radiation and the secondary radiation combine to produce white light.

2. The device of claim 1, wherein the wavelength-converting material is a phosphor and the wavelength-converting element includes a resin admixed with the phosphor.

3. The device of claim 1, wherein the wavelength-converting material is a phosphor selected from the phosphor family chemically identified as $(Sr,Ca,Ba)S:Eu^{2+}$.

4. The device of claim 3, wherein the phosphor is Strontium sulfide doped with Europium, which is chemically defined as $SrS:Eu^{2+}$.

5. The device of claim 1, wherein the wavelength converting material is a phosphor and the wavelength-converting element is an epoxy admixed with the phosphor.

6. The device of claim 1, wherein the wavelength-converting material is an organic luminescent dye.

7. The device of claim 1, wherein the wavelengt-converting element is a phosphor thin film.

8. The device of claim 1 further comprising a phosphor-converting substrate, the light emitting device being disposed on the phosphor-converting substrate.

9. The device of claim 1 further comprising a reflector cup, the light emitting device and wavelength-converting element being disposed within the reflector cup, the reflector cup having an opening through which white light produced by the LED device passes.

10. The device of claim 9 wherein the wavelength-converting element comprises one of epoxy and resin admixed with the wavelength-converting material, and wherein the reflector cup is filled with the wavelength-converting element such that the light emitting device is substantially submerged in the wavelength-converting element.

11. The device of claim 1 further comprising a diffusion screen.

12. The device of claim 1 wherein the light emitting device comprises a substrate transparent to the primary radiation, and wherein the light emitting device is mounted in a flip-chip configuration.

13. The device of claim 1 wherein the wavelength-converting element is substantially free of wavelength-converting material other than the material capable of receiving a second portion of the primary radiation and converting the second portion to secondary radiation having a peak intensity wavelength in the range of approximately 600 to approximately 620 nm.

14. The device of claim 1 wherein the wavelength-converting element is substantially free of materials capable converting the primary radiation to green light.

* * * * *